United States Patent [19]

Gates, Jr.

[11] Patent Number: 4,714,660

[45] Date of Patent: Dec. 22, 1987

[54] HARD COATINGS WITH MULTIPHASE MICROSTRUCTURES

[75] Inventor: Alfred S. Gates, Jr., Lindenhurst, Ill.

[73] Assignee: Fansteel Inc., North Chicago, Ill.

[21] Appl. No.: 812,455

[22] Filed: Dec. 23, 1985

[51] Int. Cl.⁴ .................... B24D 11/00; B32B 15/04; C04B 41/32

[52] U.S. Cl. .................................. 428/698; 428/699; 428/450; 428/472

[58] Field of Search ............... 428/450, 698, 699, 469, 428/472, 450, 701

[56] References Cited

U.S. PATENT DOCUMENTS

| | | | |
|---|---|---|---|
| 4,052,530 | 10/1977 | Fonzi ............................. | 428/698 X |
| 4,169,913 | 10/1979 | Kobayashi et al. ............. | 428/698 X |
| 4,269,899 | 5/1981 | Fuyama et al. ................. | 428/698 X |
| 4,357,382 | 11/1982 | Lambert et al. ................ | 428/699 X |
| 4,389,465 | 6/1983 | Nakai et al. .................... | 428/698 |
| 4,406,669 | 9/1983 | Sarin et al. ..................... | 428/698 X |
| 4,441,894 | 4/1984 | Sarin et al. ..................... | 428/698 X |

FOREIGN PATENT DOCUMENTS 0153758 12/1979 Japan .................................. 428/698

OTHER PUBLICATIONS

EP 0107571, 5/84, Teupin–Saunay.

Primary Examiner—Nancy A. B. Swisher
Attorney, Agent, or Firm—Barnes, Kisselle, Raisch, Choate, Whittemore & Hulbert

[57] ABSTRACT

A coated cemented carbide product comprising a cemented carbide substrate and a dense chemical vapor deposited coating having a microstructure of at least two simultaneously co-deposited phases which form a composite layer. The microstructure of the composite layer has one phase dispersed either as discrete particulates or as oriented fibrous, rod-like or columnar particulates in the other phase.

15 Claims, 7 Drawing Figures

FIG.2

HARD COATINGS WITH MULTIPHASE MICROSTRUCTURES

FIELD OF THE INVENTION

A coated cemented carbide product having a multiphase, simultaneous co-deposited coating to increase abrasive wear resistance, toughness and resistance to cracking.

BACKGROUND AND OBJECTS OF THE INVENTION

Cemented carbides are used in many cutting applications for metallic and non-metallic materials. Cemented carbides are usually prepared as a sintered product produced from a mixture of tungsten carbide powder and an iron-group binder metal, usually cobalt or nickel. Additives are included in some grades of cemented carbides to obtain improvements in certain properties, such as improved hot strength and resistance to cratering. Such additives may include one or more carbides such as titanium carbide, hafnium carbide, tantalum carbide, niobium carbide, vanadium carbide, molybdenum carbide and chromium carbide, and nitrides such as titanium nitride.

Improved resistance to abrasive wear and cratering without a significant decrease in tool strength has been sought by applying a thin coating on the surface of the cemented carbide. This composite makes it possible to achieve increased resistance to abrasion wear and cratering, provided by the coating, while the substrate has adequate resistance to breakage and deformation. One of the first coatings proposed was titanium carbide which not only substantially improved the life of the cutting tool, but also permitted a considerable increase in cutting speeds. Another coating that has achieved commercial recognition is a so-called ceramic coating in the form of an oxide, such as aluminum oxide.

Chemical vapor deposition (CVD) of metal carbides on cemented carbide substrates has been the subject of investigation in the last two to three decades, as evidenced by U.S. Pat. Nos. 2,962,388 and 2,962,399 issued to Ruppert, and also 3,640,689 issued to Glaski. Thin coatings of nitrides, silicides and carbides of the metals in Groups IVa (Ti, Zr, Hf), Va (V, Nb, Ta), and VIa (Cr, Mo, W) of the Periodic Table of the Elements were applied to cemented carbide substrates for improving the wear characteristics of cemented carbide cutting inserts.

A further development, noted above, has been the addition of a surface layer of a refractory oxide, such as aluminum oxide ($Al_2O_3$), or zirconium oxide ($ZrO_2$), including stabilized zirconium oxide. This development is described in U.S. Pat. Nos. 3,736,107 to Hale and 3,836,392 to Lux.

Multilayer coatings have been developed. These include: U.S. Pat. Nos. 3,955,038 and Re. 29,420 to Lindstrom describing an intermediate layer of carbide or nitride and an outer layer of ceramic oxide; U.S. Pat. No. 4,101,703 to Schintlmeister describing a TiC first layer, TiCN intermediate layer and TiN outer layer; U.S. Pat. No. 4,018,631 to Hale which describes a coating process including the steps of forming a selected metal carbide, nitride or carbonitride coating on a substrate, diffusing tungsten and cobalt from the substrate into the coating, oxidizing the coating, and coating the oxidized coating with an oxide; U.S. Pat. No. 4,357,382 to Lambert describing a $TaC/TiC/Al_2O_3/TiN$ coating (noted in the order of deposition of the substrate), with transition layers between the individual coating layers; U.S. Pat. No. 4,442,169 to Graham describing an $Al_2O_3$ layer with TiN or TiC deposited on it, with an intermediate TiO layer; and U.S. Pat. No. 4,463,063 to Hale describing an $Al_2O_3$ coating with a TiO interlayer provided by reduction of $TiO_2$.

Reaction-type coatings have also been described. U.S. Pat. No. 4,399,168 to Jullander discloses: first treating the substrate to form a metal carbide, nitride or carbonitride coating; heating the coated substrate near the melting point of the cemented carbide binder metal to diffuse elements from the substrate into the coating; applying an intermediate metal carbide, nitride or carbonitride coating; oxidizing, nitriding or sulfidizing a portion of the second coating; and applying a final $Al_2O_3$ coating.

U.S. Pat. No. 4,447,263 to Sugizawa describes a reaction layer of carbonitride (or oxycarbonitride) of at least two group IVa, Va and VIa metals, including titanium.

U.S. Pat. No. 4,490,191 to Hale suggests provision of a thin surface-oxidized bonding layer comprising a carbide or oxycarbide of at least one of tantalum, niobium and vanadium, optionally aluminizing the bonding layer, and finally providing an outer oxide wear layer. This patent to Hale also cites a number of U.S. and Japanese prior art patent references that describe numerous and complex intermediate coating layers.

The wear resistance of titanium oxycarbide sputter deposited coatings on cemented carbide cutting tools is reported in Carson, W. W., C. L. Leung and N. P. Suh, "Metal Oxycarbides as Cutting Tool Materials", Winter Meeting of the ASME, Houston, Tex. 1975, Paper No. 75-WA/Prod. 3. Resistance to flank wear and cratering of $TiC_{0.75}O_{0.25}$ and $TiC_{0.5}O_{0.5}$ were found to be comparable to that of TiC sputter coated inserts. However, delamination of the coatings on the flank of the inserts during machining was a persistant problem.

Titanium oxycarbide coatings applied by a CVD method on cemented carbide tools have been described in Kikuchi, J., H. Doi and T. Onishi, "Titanium Oxycarbide Coatings Via CVD Method", Proceedings of the Sixth International Conference on Chemical Vapor Deposition, Ed. by L. F. Donaghey, P. RaiChoudhury and R. N. Tauber, The Electrochem. Soc., Princeton, N.J., 1977. Formation of an intermediate layer of titanium oxycarbide is disclosed also in U.S. Pat. No. 4,463,033 to Kikuchi. From steel turning tests described in the above cited CVD Conference paper, titanium oxycarbide coatings were found to greatly increase cemented carbide tool life. Observations on the growth morphology of $Al_2O_3$ particles on a $TiC_{0.5}O_{0.5}$ coated layer led to the conclusion that this layer is an excellent substrate for an $Al_2O_3$ coating.

A CVD process to produce a co-deposited aluminum-titanium-oxide coating on cemented carbide tools is described in U.S. Pat. No. 4,052,530 to Fonzi. The addition of 2 to 10% titanium oxide increased the hardness of the coating to 2400–2500 Knoop. The co-deposited material bonded well to the substrate.

The coatings described by prior art patents have certain features that also are deficiencies. A single layer titanium carbide coating, such as applied by CVD to a cemented carbide substrate, provides substantially improved abrasion resistance, but does not provide nearly as effective resistance to cratering as that provided by aluminum oxide. The TiC layer is single phase TiC, or a single phase TiC-rich solid solution, with small amounts of elements from the substrate and coating atmosphere co-incidently being present.

A two-layer TiC and Al$_2$O$_3$ coating system was developed in an effort to obtain the above-described benefits of each separate coating. In this system, the first coating layer is a TiC phase and the outer layer is aluminum oxide. The aluminum oxide may be present partially as alpha phase Al$_2$O$_3$ and partially as kappa phase Al$_2$O$_3$, as taught in U.S. Pat. No. 4,180,400 to Smith.

In more complex coating systems of the prior art having two or more layers, each layer or lamella is a selected single phase compound (or solid solution phase of that compound). The coating systems, both single layer and multilayer types, require critical manufacturing control of the uniformity and thickness of the individual layers. Such prior art coatings are often prone to cracking, chipping or delamination.

In addition to one or more of the above deficiencies, many prior art coating systems are plagued by the formation of a brittle eta phase at the interface between the first coating layer and the substrate. U.S. Pat. No. 4,150,195 to Tobioka discloses a cemented carbide substrate containing free carbon to provide a coated article free from such eta phase.

It is accordingly an object of the present invention to provide a coated cemented carbide having the benefits of two or more simultaneously co-deposited phases throughout the entire coating, as distinguished from perceived benefits of a single phase within each particular layer as in present coatings.

Another object of the invention is to provide coatings of mixed layers, such as bands of duplex simultaneously co-deposited phases between single layers, to obtain improved toughness and to serve as crack arrestors.

A further object of the invention is to provide a coating system with improved control of the overall coating thickness.

An additional object is to provide a composite coating that minimizes or eliminates formation of eta phase.

Other objects and features of the invention will be found in the following description and claims in which the invention is described along with details directed to those skilled in the pertinent arts of the manner and process of making and using the invention, all in connection with the best mode presently contemplated for the practice of the invention.

SUMMARY OF THE INVENTION

In accordance with the present invention, a surface-coated article is provided for cutting and wear applications. The article comprises a substrate selected from the group consisting of cemented carbides, hard metals, and high temperature ceramics. Both cemented carbides and high temperature ceramics are currently employed for metal and other cutting applications. Examples of such ceramics are aluminum oxide, Sialon (SiAlON) and silicon nitride. Cemented carbide is currently preferred.

Applied to the substrate surface is a composite layer of at least two simultaneously co-deposited phases, with the first of such phases being selected from the group consisting of a carbide, nitride, carbonitride, oxycarbide, oxycarbonitride, boride or silicide of a Group IVa (Ti, Zr, Hf) or Va (V, Nb, Ta) metal; a carbide, oxycarbide, boride or silicide of a Group VIa (Cr, Mo, W) metal; and a carbide or nitride of boron or silicon. (It is understood that all references to "Group" metals refers to the Periodic Table of Elements). The second co-deposited phase is selected from the group consisting of an oxide or oxynitride of aluminum, zirconium, silicon, calcium, magnesium, titanium, hafnium and stabilized zirconium oxide. Most preferably, the co-deposited phases consist of titanium-aluminum oxycarbide and aluminum oxide, titanium-aluminum oxycarbonitride and aluminum oxide, titanium carbide and aluminum oxide, or titanium carbonitride and aluminum oxide.

In the preferred embodiment of the invention, an intermediate composite layer is deposited on the substrate surface prior to the simultaneously co-deposited layer. This intermediate composite layer is selected from the groups consisting of a carbide, carbonitride nitride, oxycarbonitride, silicide or boride of titanium, zirconium, hafnium, vanadium, niobium and tantalum; a carbide, silicide or boride of chromium, molybdenum and tungsten; and a nitride of silicon or boron. Titanium carbide is preferred.

Additional layers may be deposited on the co-deposited layer. Such additional layers are selected from the group consisting of a carbide, carbonitride, nitride, oxycarbonitride, silicide or boride of titanium, zirconium, hafnium, vanadium, niobium and tantalum; a carbide, silicide or boride of chromium, molybendum and tungsten; a nitride of silicon or boron; and an oxide or oxynitride of aluminum, titanium, zirconium, hafnium, magnesium and calcium, and stabilized zirconium oxide. Aluminum oxide is preferred.

BRIEF DESCRIPTION OF THE DRAWINGS

Drawings accompany the disclosure and may be briefly described as.

Figure 1A:
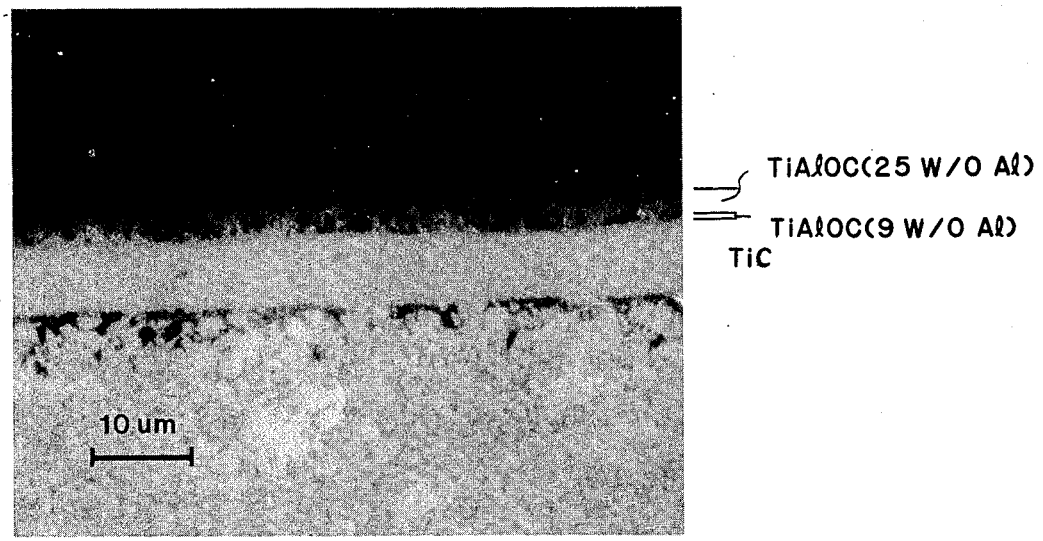
FIG. 1: Polished and Etched 90° Cross-Section of an Insert Coated with TiC/TiAlOC (9 w/o Al)/TiAlOC (25 w/o Al)
  (a) Optical Photomicrograph at 1600×.
  (b) Scanning Electron Micrograph at 3000×.

In this specification, the symbol w/o refers to percent by weight. The designation TiAlOC refers to a titanium, aluminum, oxygen and carbon-containing composition, which alternately can be designated by the general chemical formula Ti$_w$Al$_x$O$_y$C$_z$, where w, x, y and z represent the mole fractions of Ti, Al, O and C, respectively. The designation TiAlOCN refers to a titanium, aluminum, oxygen, carbon and nitrogen-containing composition, which alternately can be designated by the chemical formula Ti$_w$Al$_x$O$_y$C$_z$N$_n$, where w, x, y, z and n represent the mole fractions of Ti, Al, O, C and N, respectively.

DETAILED DESCRIPTION OF PREFERRED EMBODIMENTS

In one embodiment of this invention, a simultaneous codeposition of a thin composite film of TiAlOC solid solution and $Al_2O_3$ was produced by chemical vapor deposition (CVD) on a cemented carbide substrate. The coating was thermally activated from a mixture of titanium tetrachloride ($TiCl_4$), aluminum chloride ($AlCl_3$), hydrogen ($H_2$) and carbon monoxide (CO) gases at temperatures between 800° and 1100° C. The $TiCl_4$ gas was carried into the reactor by passing hydrogen gas into an isothermally maintained container of liquid $TiCl_4$. The $AlCl_3$ gas was formed by passing a mixture of $H_2$ and chlorine ($Cl_2$) gases over heated aluminum (Al) pellets. The temperatures of the $TiCl_4$ and $AlCl_3$ gas generators were controlled and monitored with iron-constantan thermocouples. The flow rates of the gaseous reactants were controlled by rotometers prior to mixing and delivery into the reactor. The reactor was a cylindrically symmetrical, hot-wall type (Ti-coating, Inc., Model 100V). The reactive gas mixture was distributed from a central tube over cutting tool inserts (the cemented carbide substrates) on trays, which were stacked vertically. Deposition temperatures were monitored and controlled with chromel-alumel thermocouples. Uncoated and previously CVD TiC coated cemented carbide inserts of C-6 classification (designation of Cemented Carbide Producers Association) and TNG 333E (American Standards Association Identification System, A.N.S.I.) geometry were utilized as the substrates.

Scanning electron microscope (SEM) examination and microprobe analyses were performed on the coatings using an Amray Model 1200B scanning electron microscope with a Kervex Model 7077 energy dispersion analyzer attachment. X-ray diffraction data were obtained on the coatings with a Phillips instrument using copper K-alpha X-rays focused with a graphite diffraction grating and detected with a scintillation counter. Sample inserts were prepared for examination of microstructure by sequential polishing with 150 micron and 30 micron grit diamond wheels, then finally with 5 micron diamond paste. Polished sections were etched with equal parts of 10% solutions of $K_3Fe(CN)_6$ and KOH. Coating thicknesses were measured at 1280× magnification using a calibrated eyepiece.

A modified Cazeneuve Model HB 725 lathe was used for machining wear tests on the coated inserts. The surface speeds used, 500, 575, 600 and 700 sfpm (surface feet per minute), were measured with a Hasler gauge. Feed rate was 0.011 ipr (inches per revolution), and D.O.C. (depth of cut) was 0.075 in. for these tests. The inserts were evaluated for their machining wear performance by utilizing them in a single point toolholder with a 0° anvil, a 5° negative lead angle, and a 5° negative side rake. The material machined was AISI 4140 low alloy steel with a Brinell hardness of 255 to 332. Hardness of the alloy steel workpiece was measured after each cutting pass. No coolant was employed. In these tests, a record was made of the thermal cracking, chipping, abrasive wear, crater wear and flaking of the coating. Surface roughness and other observations were determined at various time intervals during the cutting. A Mitutoyo X-Y stage microscope was used to measure flank wear. These test conditions can be considered as an accelerated life test designed to produce abrasive of flank wear and cratering on standard state-of-the-art tools essentially to the point of failure in a few minutes.

A cutting tool can fail by means of one or more of several wear processes. So-called "flank wear" is a gradual wear by abrasion which occurs at the tool flank. The primary causes of this abrasive wear are hard constituents of the workpiece material, including fragments of the built-up edge, plowing into the tool surface as they sweep over the tool. "Cratering" is a gradual wear that can occur at the tool rake face. Two surfaces are brought into intermittent contact under load and moved relative to each other, and adhesion occurs at the high temperatures generated by plastic deformation and friction. Wear is then caused by the fracture of the bond or weld that occurs between the tool and the chip from the workpiece. In addition, mechanical breakage is a problem, and any coating layers that are applied must minimize any degradation effect on the strength of the substrate.

Microstructure and composition of the TiAlOC coatings were determined by the X-ray diffraction and optical and scanning electron microscopy examinations outlined above, and are discussed in subsequent examples. Wear resistance of the TiAlOC coatings on the cemented carbide substrate was determined as a single layer coating, in multiple layer coating combinations, and as an interlayer between other types of coatings. Results are compared to standard commercial CVD coated cemented carbides. Single tooth flycutter tests also were run on the TiAlOC coated cemented carbide inserts using a 2.5 inch square AISI 4140 low alloy steel log with a Brinell hardness of 255-300. The inserts, after test, were examined for any tendency of the coating to delaminate on the flank and rake faces of the coated inserts.

In another embodiment, a simultaneous co-deposition of a thin film of TiC and $Al_2O_3$ was produced by CVD on a cemented carbide substrate. In further embodiments, the cemented carbide substrates were first CVD coated with TiC. Either a co-deposited TiAlOC solid solution and $Al_2O_3$ coating, or a co-deposited TiC and $Al_2O_3$ coating, was then applied onto the TiC coating layer.

In still additional embodiments, co-deposition of either a thin film of TiAlOCN and $Al_2O_3$, or TiCN and $Al_2O_3$, was produced by CVD on cemented carbide substrates from a mixture of gases comprising $TiCl_4$, $AlCl_3$, $H_2$, CO and nitrogen ($N_2$) at temperatures between 800° and 1100° C.

The above simultaneously co-deposited systems are exemplary. In broad aspects, the invention is concerned with the simultaneous co-deposition of at least two hardmetal compounds, or solid solutions of them, to produce a composite layer on a substrate of cemented carbides or ceramics. Essentially any two, or more, hardmetal compounds can be selected, with the limitation that the co-deposition process must be chemically and thermodynamically feasible, and the resulting combination must be useful. Such compounds for the co-deposition process can be selected from:

(1) One or more phases of: a carbide, nitride, carbonitride, oxycarbide, oxycarbonitride, boride and silicide of metals from Groups IVa (titanium, zirconium and hafnium) and Va (vanadium, niobium and tantalum); a carbide, oxycarbide, boride and silicide of metals from Group VIa (chromium, molybdenum and tungsten); and a carbide or nitride of boron or silicon; or a solid solution based on any of these. The foregoing is simultaneously co-deposited along with:

(2) One or more phases of an oxide or oxynitride of aluminum, zirconium, silicon, calcium, magnesium, titanium, hafnium, or stabilized zirconium oxide.

In another novel feature of the invention, the simultaneously co-deposited compounds, or their solid solution, can be produced in several different structural forms or morphologies in the composite coating layer, including:

(1) Fibrous, rod or column-like particulates of one phase grown perpendicular to the substrate/coating interface and dispersed and supported in a matrix of the other phase.

(2) Discrete particles of one phase dispersed in a matrix of the other phase.

The titanium-aluminum oxycarbide coatings were found to exist in phase regions:

(1) A single phase TiAlOC solid solution.
(2) A mixture of TiAlOC solid solution and alpha $Al_2O_3$.
(3) A mixture of TiC and alpha $Al_2O_3$.

Conditions under which these above phases were obtained and some characteristics of the coatings are described in Examples 1, 2, 3 and 4.

EXAMPLE 1

Cemented carbide inserts were CVD coated at 1000° C. using an input gas composition of 0.8% $TiCl_4$, 1.6% $AlCl_3$, 0.6% CO and 97.1% $H_2$ at an absolute pressure of 506 torr for a time of 4 hours. An optical photomicrograph of a polished and etched cross-section perpendicular to the surface of an insert so coated showed that the coating was orangish-pink in color and had an eta phase thickness less than 0.5 microns at the coating-substrate interface. A scanning electron microscope (SEM) examination was made of another so-called insert that was intentionally fractured normal to the coated surface. The coating had a dense fine-grained morphology with a nominal grain size of 0.5 microns ($\mu$m), which is similar to that of standard TiC CVD coatings on cemented carbides. Energy dispersion analysis of X-rays (EDAX) produced from an electron beam focused over a square area of coating indicated that the coating contained approximately 3% by weight (w/o) Al and 97 w/o Ti on a metal basis. X-ray diffraction patterns on the coating indicated it to be a single phase TiAlOC solid solution.

EXAMPLE 2

Previously CVD TiC coated cemented carbide inserts were further CVD coated at 1000° C. using an input gas composition of 0.6% $TiCl_4$, 2.3% $AlCl_3$, 0.7% CO and 96.4% $H_2$ at an absolute pressure of 150 torr for a time of 6.75 hours. An optical photomicrograph (FIG. 1) of a polished and etched cross-section perpendicular to the surface of the grey colored coating shows black spots or rod-like particulates in a grey matrix and oriented generally perpendicular to the substrate. These particulates appear white in the SEM indicating that they are discrete $Al_2O_3$ phase particles and not holes. EDAX analysis showed the coating to be composed of approximately 25 w/o Al and 75 w/o Ti on a metal basis. An analysis focused on a particulate in the coating gave a composition of 46 w/o Al and 54 w/o Ti on a metal basis. The rod-like particulates are typically about 0.5 to 1 $\mu$m diameter, and the electron beam at 15 KeV has a typical penetration depth of 2 to 3 $\mu$m. Therefore, the EDAX analysis would include some surrounding matrix material in addition to the particulates. An X-ray diffraction pattern of the coating showed it to be composed of a TiAlOC solid solution and alpha $Al_2O_3$. Therefore, with all of this evidence, the rod-like particulates are believed to be alpha $Al_2O_3$.

Figure 1B:
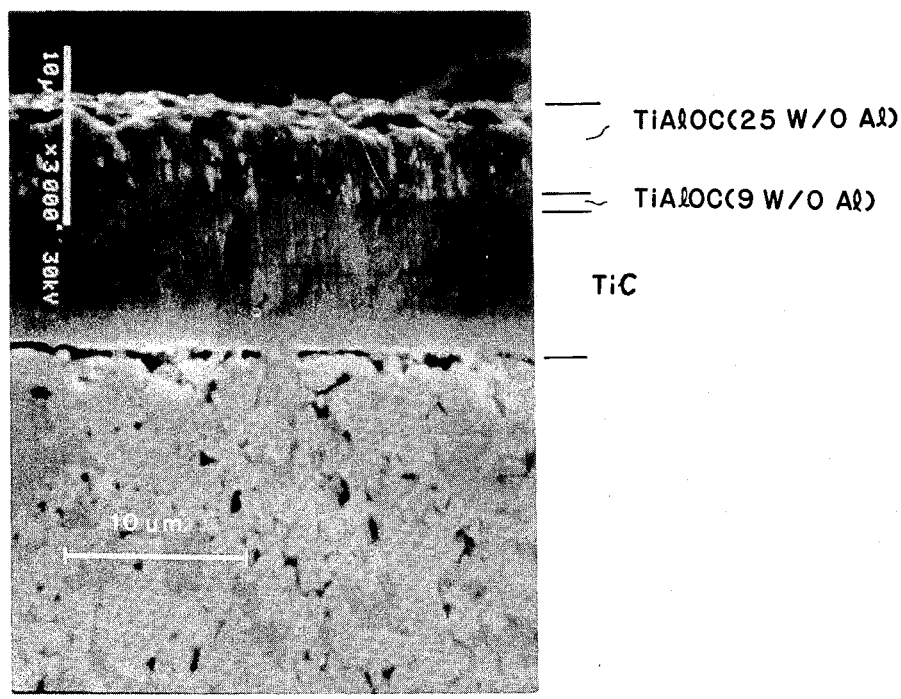

Other coating experiments with varying ratios of $TiCl_4$ to $AlCl_3$ in the coating gas atmosphere indicated that the solid solubility of aluminum in the TiAlOC phase is about 9 w/o. Evidence for this limit is the appearance of a second phase. The chemical formula on a mole (or atom) basis for the Al-saturated solid solution on this basis is about $Ti_{0.85}Al_{0.15}O_{0.5}C_{0.5}$. The EDAX scan data yields a coating composition of approximately 23 w/o $Al_2O_3$ and 77 w/o $Ti_{0.85}Al_{0.15}O_{0.5}C_{0.5}$ for the outer-most coating layer shown in FIG. 1(a) and (b). FIG. 1(a) is an optical photomicrograph at a magnification of 1600× of a CVD coated cemented carbide insert. The inner coating layer is TiC, which was applied by standard CVD practice; next is a thin coating layer of TiAlOC containing about 9 w/o Al; and the outer coating layer is TiAlOC containing about 25 w/o Al. FIG. 1(b) is a scanning electron micrograph of the same CVD coated insert as in FIG. 1(a), and shows that the $Al_2O_3$ is present partially as rod-like and partially as discrete white particulates in the TiAlOC coating layers, but not in the inner TiC layer. These white particulates of $Al_2O_3$ in FIG. 1(b) correspond to the black particulates of $Al_2O_3$ in the TiAlOC layers of FIG. 1(a).

EXAMPLE 3

Figure 2:
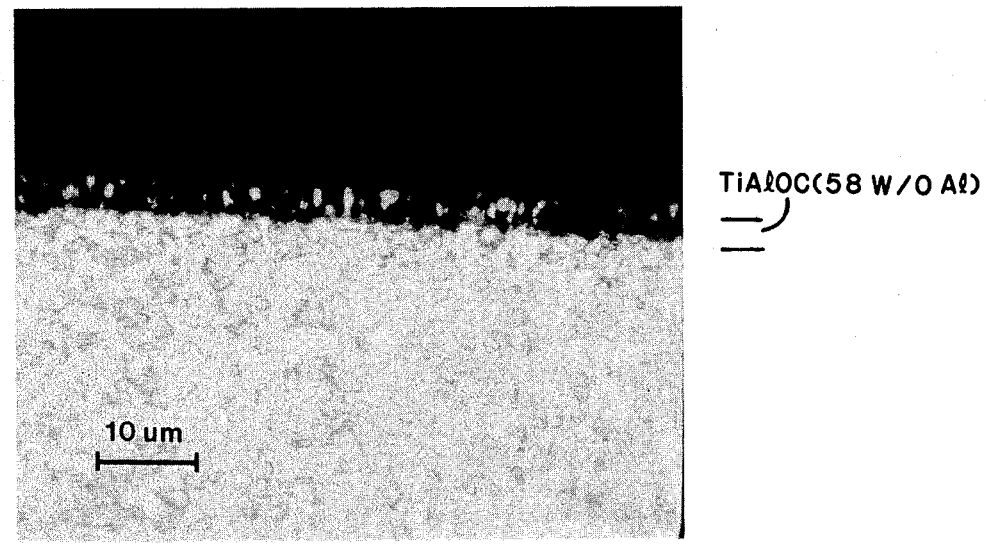
FIG. 2: Optical Photomicrograph at 1600× of a Polished and Etched 90° Cross-Section of an Insert Coated with TiAlOC containing 58 w/o Al.

Previously CVD TiC coated cemented carbide inserts were further CVD coated at 1000° C. using an input gas composition of 0.2% $TiCl_4$, 2.0% $AlCl_3$, 2.5% CO and 95.4% $H_2$ at an absolute pressure of 505 torr for a time of 6 hours. The microstructure in cross-sections of coated inserts shows (FIG. 2) a mixture of black and off-white phases. The coating was fully dense, with no porosity at the TiC/TiAlOC interface. An EDAX analysis over a square area of the TiAlOC coating showed a composition of approximately 41 w/o Al and 59 w/o Ti on a metal basis. The X-ray diffraction pattern of the coating showed it to be composed of alpha $Al_2O_3$ and TiC. At still higher sensitivity, an X-ray diffraction pattern of the coating also showed the presence of a small amount of TiAlOC solid solution. Thus, the coating was comprised of about 49 w/o TiC and 51 w/o $Al_2O_3$, with a small amount of TiAlOC solid solution.

On a similarly-coated insert (previously uncoated), the EDAX analysis showed approximately 58 w/o Al and 42 w/o Ti. If it is assumed that this TiAlOC coating is composed entirely of $Al_2O_3$ and TiC, the coating is composed of about 68 w/o $Al_2O_3$ and 32 w/o TiC. In the microstructure of the coatings of this example, the $Al_3$ phase appears to be present partially as discrete particulates and partially as columns normal to the surface.

EXAMPLE 4

After all the experimental CVD depositions of the TiAlOC coatings described in Examples 1, 2 and 3, a gas phase precipitate was present as a fine powder in parts of the coating system, and was especially found in the central gas distribution system. In spite of the intentional changes made in the concentrations of $TiCl_4$, $AlCl_3$, CO and $H_2$ gases to produce the various TiAlOC coating compositions described, the composition of the gas phase precipitate remained nearly constant at a weight ratio of about 70% $Al_2O_3$ and 30% TiC, along with a small amount of TiAlOC solid solution. Yet, as discussed in Examples 1, 2 and 3, the compositions of the TiAlOC depositions ranged from a single phase solid solution of TiAlOC containing about 3 w/o Al to a coating composition similar to that of the gas phase precipitate. In addition, as discussed above, the $Al_2O_3$ phase appeared to be either in the form of discrete particulates or as fibrous, rods or columns in the higher Al content, twophase coatings. These results suggest that absorption, surface diffusion and nucleation are all important factors during the deposition of TiAlOC coatings. This suggestion results because the gas phase composition is expected to be reasonably constant on a given surface, but many discrete regions of apparent epitaxial growth of either TiAlOC solid solution and $Al_2O_3$, or $Al_2O_3$ and TiC are found across the entire coated surface.

In a further experiment, it was found that no deposition occurred on cemented carbide inserts when $AlCl_3$, CO and $H_2$ gases were introduced into a reactor at 1000° C. Therefore, the mechanism of deposition of a TiAlOC coating must depend upon $TiCl_4(g)$ or a reduced $TiCl_x(g)$ molecule.

DISCUSSION OF EXAMPLES 1, 2 AND 3 AND 4

The TiAlOC coatings deposited in the examples described exist in at least four phase regions. The first phase region is a single phase TiAlOC solid solution containing a maximum of 9 w/o Al, or somewhat less. While not wishing to be bound by theory, I believe that this solid solution is formed by aluminum ions occupying tetrahedral sites in a titanium oxycarbide crystal lattice. The second region is a two-phase region of a TiAlOC solid solution and alpha phase $Al_2O_3$, which forms when the Al content exceeds 9 w/o. The third two-phase region, in which the TiAlOC coating is composed of TiC and alpha phase $Al_2O_3$, is observed at Al contents at about 41 w/o, and extending essentially to a single phase fourth region of $Al_2O_3$ solid solution nearly at pure $Al_2O_3$. An additional three-phase region composed of TiC, alpha $Al_2O_3$ and TiAlOC solid solution may exist in TiAlOC coatings containing between about 25 to 41% w/o Al.

EXAMPLE 5

Figure 3:
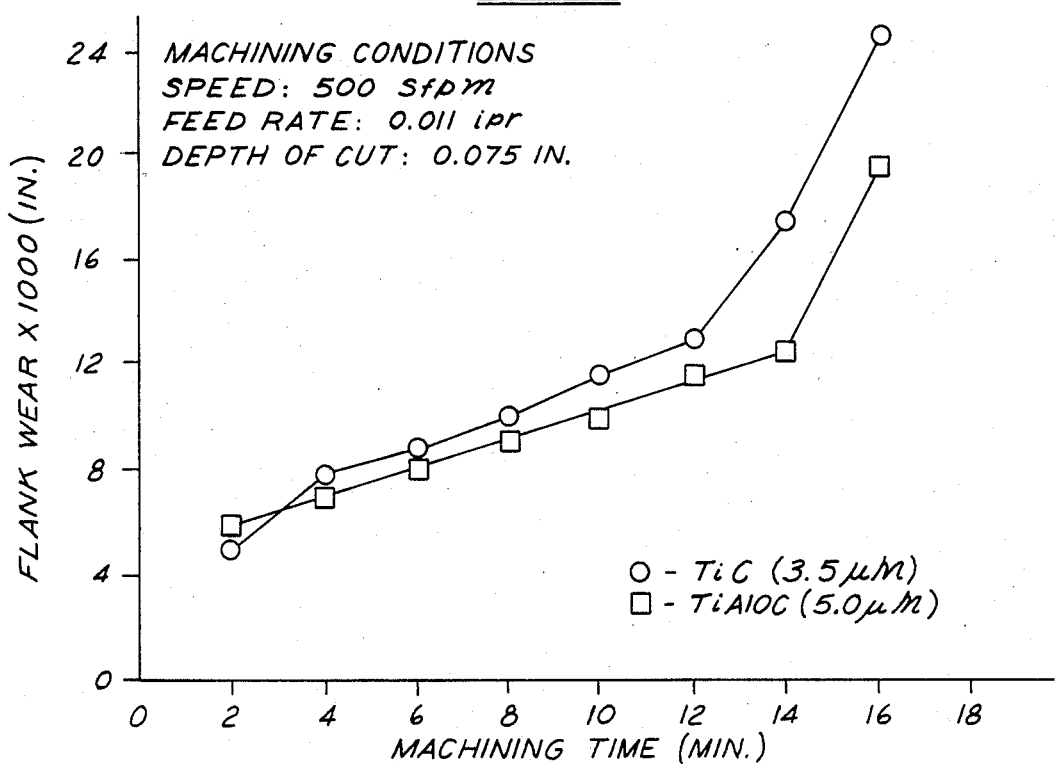
FIG. 3: A graph which illustrates Flank Wear Vs. Machining Time for Turning AISI 4140 Steel (255–290 Bhn) with TiC and TiAlOC (3 w/o Al) Coated Inserts.
Figure 4:
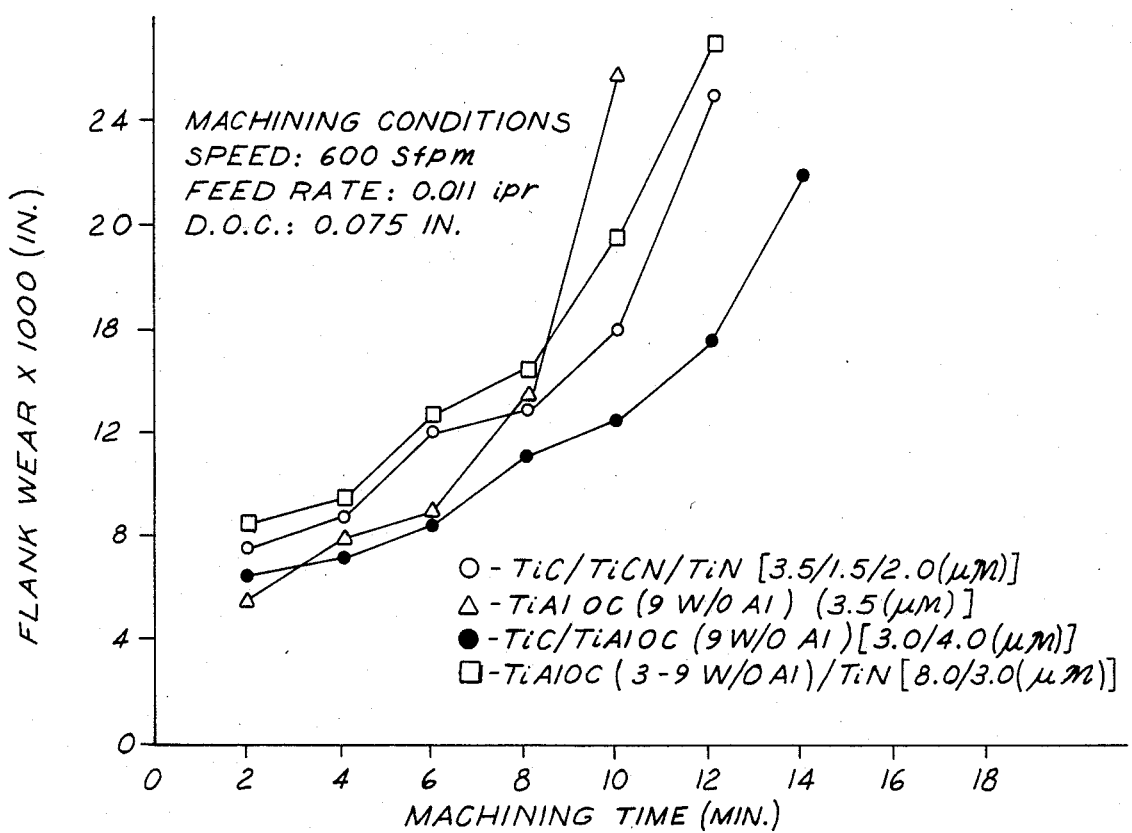
FIG. 4: A graph which illustrates Flank Wear Vs. Machining Time for Turning AISI 4140 Steel (280–310 Bhn) with Inserts Coated with TiC/-TiCN/TiN, TiAlOC, TiC/TiAlOC and TiAlOC/-TiN.

Inserts with TiAlOC coatings, which have Al contents of 3, 9 and 25 w/o, were found to have wear resistance in cutting tests which are similar to inserts CVD coated with standard state-of-the-art TiC and TiC/TiCN/TiN. In FIG. 3, the inserts coated with TiC and TiAlOC at an Al content of 3 w/o have similar wear rates, and crater wear began at about the same time for both inserts. The wear rates of the inserts coated with TiAlOC (9 w/o Al), TiC/TiAlOC (9 w/o Al), and TiAlOC (3 to 9 w/o Al)/TiN are similar to or somewhat better than the insert coated with TiC/TiCN/TiN, as shown in FIG. 4. It is expected that the TiAlOC coated insert would have had better crater and wear resistance if the coating would have been 6 to 7 μm thick. However, the small variations seen in wear resistance are nearly within the uncertainty of ±15% usually experienced in these wear tests.

Figure 5:
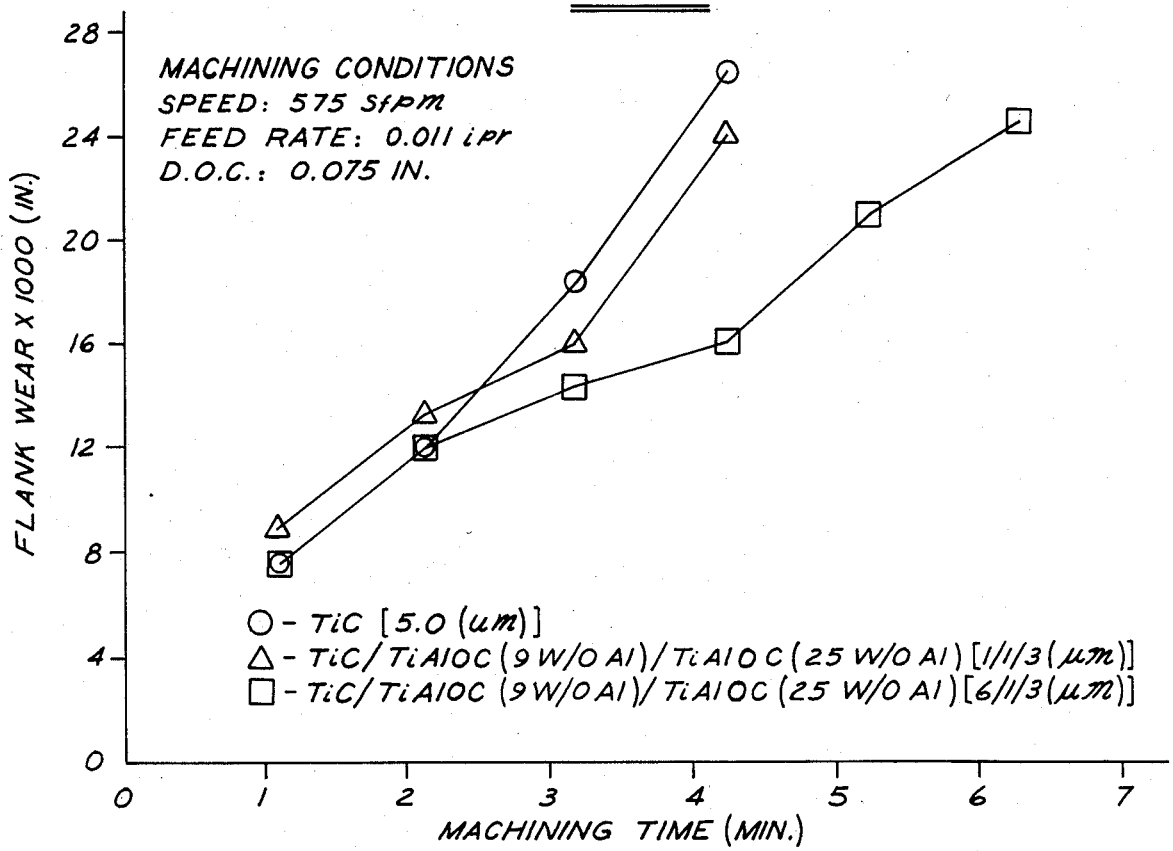
FIG. 5: A graph which illustrates Flank Wear Vs. Machining Time for Turning AISI 4140 Steel (332 Bhn) with Inserts Coated with TiC and TiC/-TiAlOC (9 w/o Al)/TiAlOC (25 w/o Al).

Similarly, the wear rates of the inserts coated with TiC and TiC/TiAlOC (9 w/o Al)/TiAlOC (25 w/o Al) of the same total coating thickness are similar, as shown in FIG. 5. The reason for the improved wear resistance of the insert coated with TiC/TiAlOC (9 w/o Al)-/TiAlOC (25 w/o Al) of 10 μm total coating thickness is due to the improved crater wear resistance of the thicker coating. From reported data, (see Hale T. and D. Graham, "How Effective are the Carbide Coatings," Modern Machine Shop, April, 1981, pp. 98–105), it is known that crater wear resistance increases with increasing coating thickness, and that flank wear resistance is similar for coatings thicker than 5μm for TiC coated cutting tools when machining long-chip materials. Thus, flank wear resistance is similar for cutting tool inserts coated with TiC, TiC/TiCN/TiN, and TiC/TiAlOC with Al contents up to 25 w/o.

Figure 6:
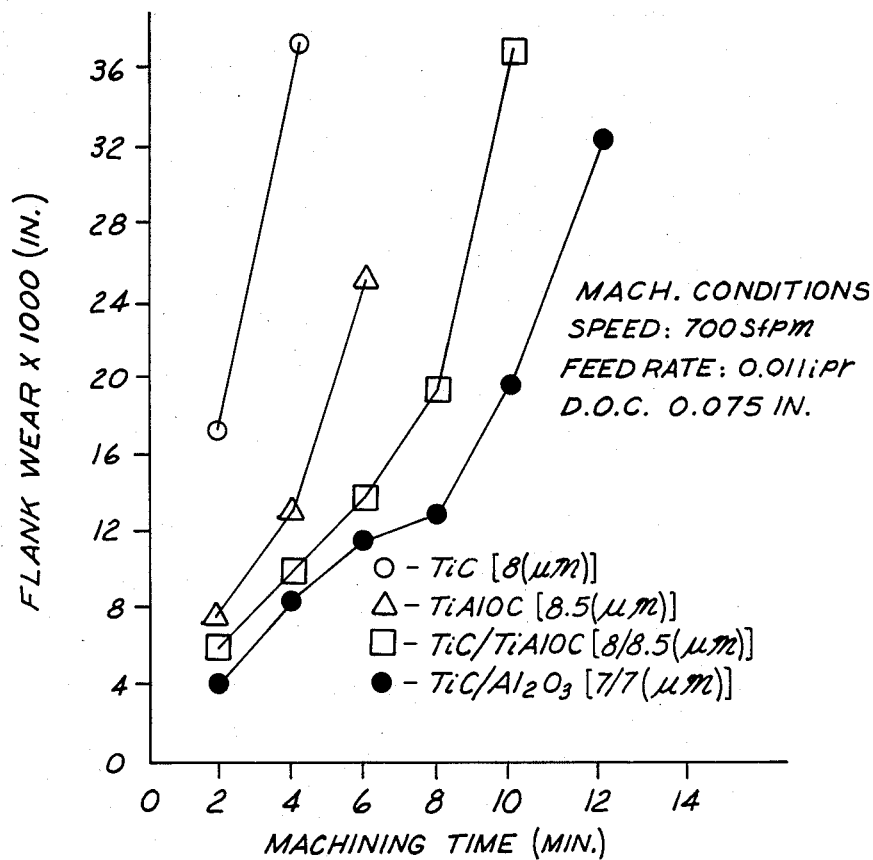
FIG. 6: A graph which illustrates Flank Wear Vs. Machining Time for Turning AISI 4140 Steel (297 Bhn) with Inserts Coated with TiC, TiC/Al$_2$O$_3$,- TiC/TiAlOC(58 w/o Al) and TiAlOC (58 w/o al).

The wear resistance of the TiAlOC coating improves dramatically when it is composed of co-deposited TiC and $Al_2O_3$ phases. The insert coated with the multiphase TiAlOC (58 w/o Al) is seen to have a better wear resistance than the TiC coated insert, and the insert coated with TiC/TiAlOC (58 w/o Al) has flank and crater wear resistance which approaches that of TiC/$Al_2O_3$ coated inserts, as shown in FIG. 6. The reason for the lower wear resistance of the TiAlOC (58 w/o Al) coated insert when compared with the insert coated with TiC/TiAlOC (58 w/o Al) is that the lower crater wear resistance of the TiAlOC coated insert results in deformation wear at the cutting speed used in this test. The reason for the lower crater wear resistance was due to porosity observed at the coating-to-substrate interface at positions where cobalt would be expected. When crater wear begins, the coating fractures in this region and the chip material adheres to the coating, and large areas of coating are removed from the surface in the region of crater wear. Similar observations have been made when $Al_2O_3$ is coated by CVD directly onto a cemented tungsten carbide substrate (see Johannesson, T. R., and J. N. Lindstrom, J. Voc. Sci. Technol., 12(4), 1975, pp. 854–857).

On the other hand, no porosity exists at the TiC-to-TiAlOC interface, as discussed previously, which results in improved crater wear resistance. Similar observations have been made with TiC/TiAlOC (41 w/o Al) coated inserts. Single tooth flycutter tests on 2.5 inch square AISI 4140 low alloy steel logs caused inserts coated with TiAlOC to delaminate on the flank and rake face after one pass, but inserts coated with TiC/TiAlOC did not show signs of delamination. Thus, TiAlOC coatings applied over a TiC first coating provide an outstanding combination of abrasive wear and crater resistance, along with good adherence, resistance to chipping and toughness, as evidenced by these shock tests.

EXAMPLE 6

In this example, TiAlOC coatings were modified by additions of nitrogen during the coating process to produce TiAlOCN coating compositions. Cemented carbide inserts of TNG-333E were CVD coated at 1000° C. using an input gas composition comprising 76.6% to 76.8% hydrogen-containing gas, 18.4% $N_2$, 3.9% CO, 0.8% $AlCl_3$ and varying amounts of $LiCl_4$, as shown in Table I, at an absolute pressure of 505 torr for a deposition time of 5 hours. This resulted in a single phase TiAlOCN solid solution when the highest concentration of $TiCl_4$ was used. At lower $TiCl_4$ concentrations, a two-phase microstructure was co-deposited, consisting of a TiAlOCN solid solution and rods of $Al_2O_3$. The concentration of $Al_2O_3$ increased essentially progressively as an inverse of $TiCl_4$ concentration.

TABLE I

Phase Composition of CVD TiAlOCN Coatings as Related to Concentration of Titanium Tetrachloride in Coating Atmospheres

| Example No. | TiCl₄ % | Total Coating Thickness (Microns) | Coating Microstructure and Color | Phases Produced |
|---|---|---|---|---|
| 6.1 | 0.45 | 9.5 | Grayish yellow, no rods | TiAlOCN solid solution |
| 6.2 | 0.30 | 8.0 | Gray with very light density, thin black rods | TiAlOCN solid solution plus concentration of Al₂O₃ rods |
| 6.3 | 0.23 | 8.5 | Off-white with light to medium density, slender black rods | TiAlOCN solid solution plus light to medium concentrations of Al₂O₃ rods |
| 6.4 | 0.18 | 7.0 | Similar to Example 6.3 | Similar to Example 6.3 |

The introduced nitrogen is believed to be associated essentially entirely with the resulting solid solution TiAlOCN phase. This observation is based on the color differences of the TiAlOCN phase of this example compared to that of the TiAlOC phase in the earlier examples. Furthermore, the inserts with the TiAlOCN coating have a yellow color layer less than 0.5 μm thick at the coating-substrate interface. This layer is probably a nitrogen-rich TiAlOCN phase that is produced because the nitrogen gas is one of the first gases introduced into the reactor at the start of the deposition. In addition, the appearance and growth habit of the co-deposited Al₂O₃ second phase, when it is present, is similar for the TiAlOCN and the TiAlOC deposited coatings. The color and appearance of the microstructures of the TiAlOCN coatings are included in Table I. The solid solubility of aluminum in the TiAlOCN phase is believed to be about 0.15 mole fraction, or about the same as that in the TiAlOC phase discussed earlier.

Turning and shock tests were run on the TiAlOCN coated inserts in comparison to state-of-the-art inserts designated commercially as 663 and 680. The 663 inserts had a total coating thickness of 9.5 μm on a cemented carbide substrate consisting of 1.5 μm TiN/TiCN, 4.0 μm TiC, 2.0 μm TiCN and 2.0 μm TiN listed in order from substrate to outer layer. The 680 inserts had a total coating thickness of 17 μm consisting of 3.5 μm TiN/TiCN (inner layer), 2.5 μm TiC, 5.5 μm Al₂O₃ and 5.5 μm TiN (outer layer).

The machining tests were run on AISI 4140 low alloy steel with a hardness of 290 to 313 Bhn. The lathe-turning cutting tests were conducted at 650 to 700 SFPM, 0.011 IPR and 0.075-inch D.O.C. The wear data for the various types of coated inserts after a 4-min. cutting time are summarized in Table II.

The shock tests were conducted with a single tooth flycutter on 2½-inch square bars of 4140 steel. The number of cutting passes at which failure occurred for the various inserts is also summarized in Table II. Compared to the state-of-the-art inserts, the co-deposited TiAlOCN coated inserts had wear resistance better than 663 inserts in all cases and equivalent to 680 inserts in one case, along with shock resistance equivalent to that of 663 inserts in some cases and equivalent to or better than that of 680 inserts in all cases. In the shock test, the inserts coated with TiAlOCN showed no delamination of the coating after one pass.

Thus, the co-deposited TiAlOCN type coatings can provide an excellent combination of wear and shock resistance.

EXAMPLE 7

In this example, ZrAlOCN coatings were produced. Cemented carbide inserts were used as the substrate. A ZrAlOCN layer was produced on some inserts that had been previously coated with a TiC layer by state-of-the-art CVD practice, and on other inserts that had an uncoated substrate. The ZrAlOCN coating was accomplished by chemical vapor deposition at 1050° C. using an input gas composition comprising 75.7% hydrogen-containing gas, 18.9% N₂, 4.0% Co, 0.8% AlCl₃ and 0.6% ZrCl₄ at an absolute pressure of 500 torr for a deposition time of 2 hours. The resulting coating had a thickness of about 3 μm. The ZrAlOCN coating layer was observed to have a two-phase, co-deposited microstructure comprising ZrAlOCN solid solution and Al₂O₃ similar to that shown in FIGS. 1(a) and 1(b) for a TiAlOC coating. The Al₂O₃ appeared partially as rod-like particulates and partially as discrete particulates. This morphology is essentially analogous to that observed for TiAlOCN and TiAlOC coatings previously described.

A ZrAlOC coating can be produced essentially using the general coating parameters of this example, except for omitting the nitrogen flow.

TABLE II

Turning and Shock Test Data on CVD Coated Inserts

| Type Coated Insert | Coating Microstructure (substrate to surface) | Turning Test, Wear, In. After 4 Min. Cutting Time | Shock Test, No. Passes |
|---|---|---|---|
| Example 6.1 | TiAlOCN solid solution | 0.0195 | 5 |
| Example 6.2 | Co-deposited TiAlOCN solid solution plus Al₂O₃ rods (light concentration) | 0.0175 | 8 |
| Example 6.3 | Co-deposited TiAlOCN solid solution plus Al₂O₃ rods (light to medium concentration) | 0.0120 | 10 |
| Example 6.4 | Similar to Example 6.3 | 0.0175 | 10 |
| 663 | TiN/TiCN/TiC/TiCN/TiN | 0.0215 | 10 |
| 680 | TiN/TiCN/TiC/Al₂O₃/TiN | 0.0130 | 5 |

The invention claimed is:

1. A surface-coated article for cutting and wear applications comprising:
    (a) a substrate selected from the group consisting of cemented carbide, hard metals and high-temperature ceramics, and
    (b) a first chemical vapor deposition coating on said substrate comprised of a composite layer of at least two simultaneously co-deposited phases, a first of said phases being selected from the group consisting of: a carbide, carbonitride, nitride, oxycarbide, oxycarbonitride, silicide or boride of titanium, zirconium, hafnium, vanadium, niobium and tantalum; a carbide, silicide or boride of chromium, molybdenum and tungsten; and a carbide or nitride of silicon and boron; and a second of said phases being selected from the group consisting of an oxide or oxynitride of aluminum, titanium, zirconium, hafnium, magnesium, silicon and calcium, or stabilized zirconium oxide; said co-deposited phases comprising at least one phase present in fiber, rod-like or columnar form oriented with longitudinally axes in a direction normal to the substrate/coating interface in said composite layer.

2. A surface-coated article according to claim 1 wherein said substrate is cemented carbide.

3. A surface-coated article according to claim 1 wherein said first phase is selected from the group consisting of titanium-aluminum oxycarbide solid solution and titanium carbide.

4. A surface-coated article according to claim 1 wherein said second phase is comprised essentially of aluminum oxide.

5. A surface-coated article according to claim 1 wherein said second phase is comprised essentially of alpha aluminum oxide.

6. A surface-coated article according to claim 1 wherein said co-deposited phases comprise at least one phase present as discrete dispersed particles in said composite layer.

7. A surface-coated article according to claim 1 wherein said second phase is present as discrete dispersed particles in said composite layer.

8. A surface-coated article according to claim 1 wherein said second phase is present in fiber, rod-like or columnar form oriented in said co-deposited layer in a direction normal to the substrate/coating interface in said composite layer.

9. A surface-coated article according to claim 1 further comprising: (c) a second coating adjacent said substrate between said substrate and said first coating, said second coating comprising a layer selected from the group consisting of a carbide, carbonitride, nitride, oxycarbonitride, silicide or boride of titanium, zirconium, hafnium/ vanadium, niobium and tantalum; a carbide, silicide or boride of chromium, molybdenum and tungsten; and a nitride of silicon or boron.

10. The surface-coated article according to claim 9 wherein said second coating is comprised of titanium carbide.

11. A surface-coated article according to claim 1 further comprising an outer coating adjacent said co-deposited layer, said outer coating comprising at least one layer selected from the group consisting of a carbide, carbonitride, nitride, oxycarbonitride, silicide or boride of titanium, zirconium, hafnium, vanadium, niobium and tantalum; a carbide, silicide or boride of chromium, molybdenum and tungsten; a nitride of silicon or boron; and an oxide or oxynitride of aluminum, titanium, zirconium, hafnium, magnesium and calcium, or stabilized zirconium oxide.

12. The surface-coated article according to claim 11 wherein said outer coating is comprised of aluminum oxide.

13. A surface-coated article for cutting or wear applications comprising:
a cemented carbide substrate, and
a first coating on said substrate comprised of at least two simultaneously co-deposited phases, comprising a matrix phase selected from titanium-aluminum oxycarbide solid solution and titanium carbide, and a second phase being comprised of aluminum oxide as discrete dispersed particles or in fiber, rod-like or columnar form supported in the matrix.

14. The surface-coated article according to claim 13 further comprising a second coating intermediate said first coating and said substrate, said second coating being comprised of titanium carbide.

15. The surface-coated article according to claim 14 further comprising a third coating over said first coating, said third coating being comprised of aluminum oxide.

* * * * *